(12) United States Patent
Tamaki

(10) Patent No.: US 8,093,152 B2
(45) Date of Patent: Jan. 10, 2012

(54) TRENCH FORMING METHOD

(75) Inventor: Sadaharu Tamaki, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 12/656,911

(22) Filed: Feb. 19, 2010

(65) Prior Publication Data

US 2010/0216311 A1    Aug. 26, 2010

(30) Foreign Application Priority Data

Feb. 20, 2009    (JP) .................................. 2009-037807

(51) Int. Cl.
*H01L 21/311* (2006.01)
(52) U.S. Cl. .............................. 438/700; 257/E21.249
(58) Field of Classification Search .................. 438/700; 257/E21.249
See application file for complete search history.

(56) References Cited

U.S. PATENT DOCUMENTS

| 6,071,823 | A * | 6/2000 | Hung et al. .................... 438/714 |
| 2002/0056886 | A1* | 5/2002 | Usui et al. ..................... 257/506 |
| 2007/0072389 | A1* | 3/2007 | Cho et al. ...................... 438/427 |
| 2010/0003823 | A1* | 1/2010 | Chen et al. .................... 438/701 |

FOREIGN PATENT DOCUMENTS

JP    2006-093269 A    4/2006

* cited by examiner

*Primary Examiner* — Alexander Ghyka
*Assistant Examiner* — Stanetta Isaac
(74) *Attorney, Agent, or Firm* — Rabin & Berdo, PC

(57) ABSTRACT

A trench forming method for forming trenches without creating gouges at the boundary between a masking oxide film and a semiconductor layer and at the boundary between an oxide film insulating layer and the semiconductor layer, includes at least three etching steps each using, as the etching gas, one of at least two types of etching gases that respectively contain different components.

11 Claims, 5 Drawing Sheets

TRENCH FORMING METHOD

BACKGROUND OF THE INVENTION

1. Field of the Invention

The present invention relates to a method of forming trenches in an SOI substrate.

2. Description of the Related Art

Methods of forming trenches are known in which trenches are formed by anisotropic dry etching in an SOI (Silicon On Insulator) substrate in which an oxide film insulating layer and a silicon semiconductor layer are laid one over another on a silicon support substrate. This etching is performed by etching the silicon semiconductor substrate from its surface through the plasma action of an etching gas. A mixed gas containing fluorine-containing gas and oxygen gas, for example, is used as the etching gas. For example, Japanese Patent Kokai No. 2006-93269 (Patent literature 1) discloses an etching method including a first etching step of forming a tapered opening in a silicon semiconductor layer using a first etching gas containing fluorine-containing gas and $O_2$ and a second etching step of performing etching through the tapered opening using a second etching gas containing fluorine-containing gas, $O_2$, and HBr.

SUMMARY OF THE INVENTION

Using a mixed gas containing fluorine-containing gas (SF6) and oxygen gas ($O_2$) as the etching gas for etching the surface of the silicon semiconductor layer, however, causes the problem that so-called "gouges" are created by notching at the boundary between a masking oxide film, which serves as an etching mask, and the silicon semiconductor layer. FIG. 1A is a cross-sectional photographic image of a trench 70b formed using a mixed gas containing fluorine-containing gas (SF6) and oxygen gas ($O_2$) as the etching gas. The figure shows results of etching at a gas flow rate of 30 sccm (standard cc/min) for SF6 and 30 sccm for $O_2$ and a chamber internal pressure of 25 mT. The trench depth is about 10 μm and the etching time is about 260 seconds.

FIG. 1B is a cross-sectional photographic image showing, in enlarged view, a portion 111b of a boundary 110b between a masking oxide film 40b and a silicon semiconductor layer 30b. A gouge 112 due to etching occurs at the boundary 110b. FIG. 1C is a cross-sectional photographic image showing, in enlarged view, a portion 121b of a boundary 120b between an oxide film insulating layer 20b and the silicon semiconductor layer 30b. A gouge 122 due to etching occurs at the boundary 120b.

In applications such as high power MOS, an insulating film is formed inside the trench 70b. However, there is the problem that the presence of gouges 112, 122 decreases the breakdown voltage. Further, in cases where electrodes are formed on the insulating film formed on the inner wall of the trench 70b, there is the problem that the gouge 112 or 122 is likely to cause a short.

The present invention was made in view of the above problems and an object thereof is to provide a trench forming method of forming trenches without creating gouges at the boundary between a masking oxide film and a semiconductor layer or at the boundary between an oxide film insulating layer and the semiconductor layer.

A trench forming method of the present invention includes a substrate preparation step of preparing an SOI substrate in which an insulating layer and a silicon semiconductor layer are laid one over another on a support substrate; an oxide film forming step of forming an oxide film on a surface of the silicon semiconductor layer; an oxide film removing step of removing a portion of the oxide film; and an etching step of etching, using an etching gas, the surface of the silicon semiconductor layer with the oxide film as a mask to form a trench that reaches the insulating layer. The above etching step includes at least three etching steps each using, as the etching gas, one of at least two types of etching gases that respectively contain different components.

The trench forming method of the present invention can form trenches without creating gouges at the boundary between a masking oxide film layer and a semiconductor layer or at the boundary between an oxide film insulating layer and the semiconductor layer.

DETAILED DESCRIPTION OF THE INVENTION

Embodiments of the present invention will be described in detail below with reference to the accompanying drawings.

First Embodiment

FIGS. 2A-2E are cross-sectional views of steps in a trench forming method according to the present embodiment. The process steps of forming a trench in an SOI substrate 1 will be described below with reference to FIGS. 2A-2E.

Figure 1A:
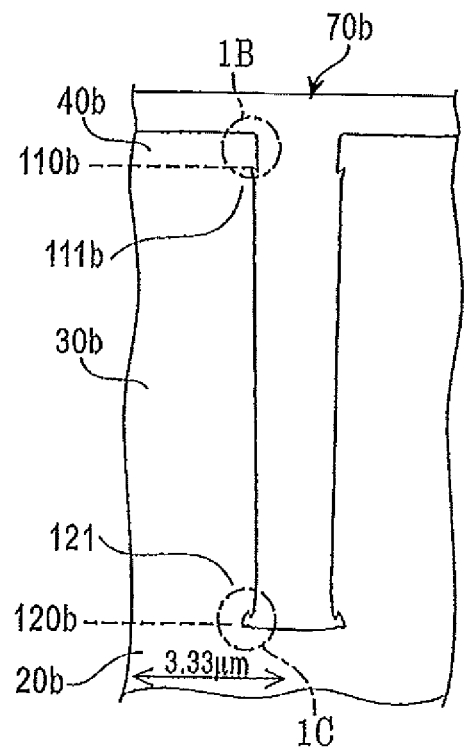
FIGS. 1A-1C are cross-sectional photographic images of a trench formed by a conventional trench forming method.
Figure 1B:
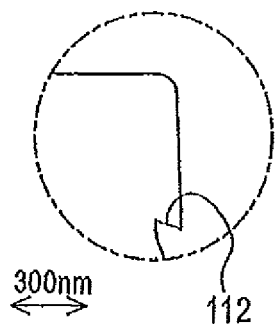
Figure 1C:
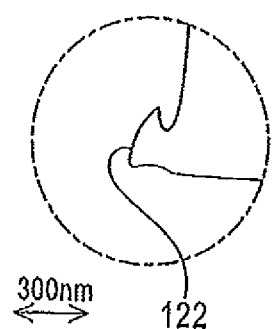
Figure 2A:
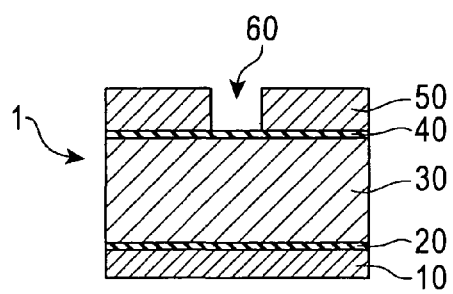
FIGS. 2A-2E are cross-sectional views of steps in a trench forming method according to a first embodiment.

First, as illustrated in FIG. 2A, an SOI substrate 1 is prepared which has a support substrate 10 made of a semiconductor such as silicon, an insulating layer 20 made of an insulating film such as an oxide film, and a semiconductor layer 30 made of a semiconductor such as silicon laid one over another in that order.

Next, a masking oxide film 40, which serves as an etching mask, is formed on the surface of the semiconductor layer 30 by the CVD (Chemical Vapor Deposition) method. The masking oxide film 40 is a silicon oxide film and has a thickness of about 500 nm, for example.

Next, a resist 50, which serves as an etching mask, is formed by photolithography on the masking oxide film 40 except on a trench forming region 60 where a trench is to be formed in a later step. The resist 50 is, for example, a positive photosensitive resist cured by exposure to light and has a thickness of 10 μm, for example.

Figure 2B:
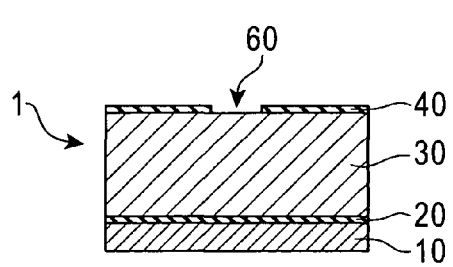

Next, as illustrated in FIG. 2B, a portion of the masking oxide film 40 corresponding to the trench forming region 60 is etched by dry etching with the resist 50 as a mask. The resist 50 is then removed.

Then, the semiconductor layer 30 is etched by dry etching with the masking oxide film 40 as a mask. The dry etching includes three etching steps.

Figure 2C:
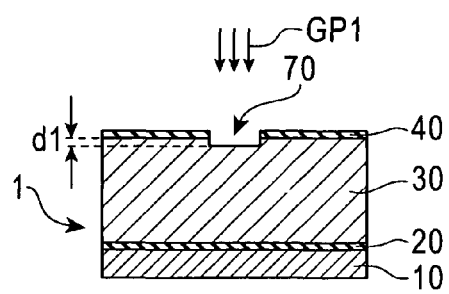

First, the first etching step will be described with reference to FIG. 2C. The first etching step uses, as an etching gas, a first mixed gas containing hydrogen bromide gas (HBr). The SOI substrate 1 having the masking oxide film 40 formed thereon is secured to a substrate-securing table inside a not-shown chamber. The chamber is first evacuated, and the first mixed gas is then introduced into the chamber at a gas flow rate of, for example, 30 sccm for HBr, so that the chamber internal pressure is at 25 mT, for example. The surface of the semiconductor layer 30 is then etched with the masking oxide film 40 as a mask, by gas plasma GP1 of the first mixed gas created by a high-frequency electric field formed between the substrate-securing table and a not-shown electrode disposed opposite the table. At this time, the layer 30 is etched down by a thickness d1 equal to, e.g., about 10% of the distance from the surface of the semiconductor layer 30 to the insulating layer 20 (which distance is hereinafter referred to as a trench depth).

Note that the first mixed gas may be a gas consisting only of hydrogen bromide gas (HBr). Instead, the first mixed gas may be a mixed gas containing hydrogen bromide gas (HBr) as its main component and also containing a slight amount of other gas such as fluorine-containing gas. In this case, the flow rate of the other gas is, for example, within a range of 1/20 to 1/10, preferably 1/50 or less, of the flow rate of hydrogen bromide gas (HBr). Even in cases where the first mixed gas contains fluorine-containing gas and oxygen gas ($O_2$) as the other gas, the flow rate thereof (or the content in the mixed gas; the same applies hereinafter) is, as a matter of course, smaller than the flow rate of fluorine-containing gas and oxygen gas ($O_2$) contained in a second mixed gas in the subsequent second etching step. In this case, the flow rate of fluorine-containing gas and oxygen gas ($O_2$) in the first mixed gas is, for example, within a range of 1/20 to 1/10, preferably 1/50 or less, of the flow rate of fluorine-containing gas and oxygen gas ($O_2$) in the second mixed gas.

Figure 2D:
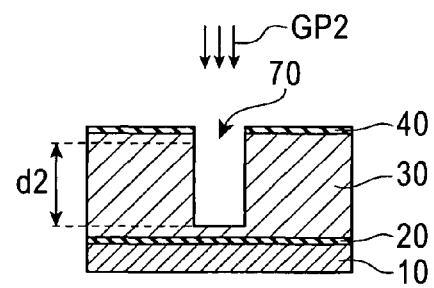

Next, the second etching step will be described with reference to FIG. 2D. The second etching step uses, as an etching gas, the second mixed gas containing fluorine-containing gas (such as $SF_6$) and oxygen gas ($O_2$). The first mixed gas is exhausted from the not-shown chamber, and the second mixed gas is then introduced into the chamber at a gas flow rate of, for example, 30 sccm for $SF_6$ and 30 sccm for $O_2$, so that the chamber internal pressure is at 25 mT, for example. The semiconductor layer 30 is then etched with the masking oxide film 40 as a mask, by gas plasma GP2 of the second mixed gas created in the same way as above. At this time, the layer 30 is etched down by a thickness d2 equal to, e.g., about 80% of the trench depth.

Note that the second mixed gas may be a mixed gas consisting only of fluorine-containing gas and oxygen gas ($O_2$) and containing no other gas whatsoever such as hydrogen bromide gas (HBr). Instead, the second mixed gas may be a mixed gas containing fluorine-containing gas and oxygen gas ($O_2$) as its main components and also containing a slight amount of other gas such as hydrogen bromide gas (HBr). In this case, the flow rate of the other gas is, for example, within a range of 1/20 to 1/10, preferably 1/50 or less, of the total flow rate of fluorine-containing gas and oxygen gas ($O_2$). Even in cases where the second mixed gas contains hydrogen bromide gas (HBr) as the other gas, the flow rate thereof is, as a matter of course, smaller than the flow rate of hydrogen bromide gas (HBr) contained in the first mixed gas. In this case, the flow rate of hydrogen bromide gas (HBr) in the second mixed gas is, for example, within a range of 1/20 to 1/10, preferably 1/50 or less, of the flow rate of hydrogen bromide gas (HBr) in the first mixed gas. Further, the flow rate of hydrogen bromide gas (HBr) in the second mixed gas is smaller than the flow rate of hydrogen bromide gas (HBr) contained in a third mixed gas in the subsequent third etching step. In this case, the flow rate of hydrogen bromide gas (HBr) in the second mixed gas is, for example, within a range of 1/20 to 1/10, preferably 1/50 or less, of the flow rate of hydrogen bromide gas (HBr) in the third mixed gas.

Figure 2E:
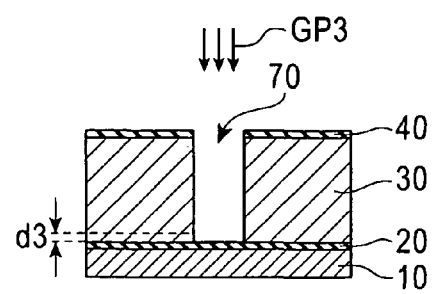

Next, the third etching step will be described with reference to FIG. 2E. The third etching step uses, as an etching gas, the third mixed gas containing hydrogen bromide gas (HBr). The second mixed gas is exhausted from the not-shown chamber, and the third mixed gas is then introduced into the chamber at a gas flow rate of, for example, 30 sccm for HBr, so that the chamber internal pressure is at 25 mT, for example. The semiconductor layer 30 is then etched with the masking oxide film 40 as a mask, by gas plasma GP3 of the third mixed gas created in the same way as above. At this time, the layer 30 is etched down by a thickness d3 equal to, e.g., about 10% of the trench depth.

Note that the third mixed gas may be a gas consisting only of hydrogen bromide gas (HBr). Instead, the third mixed gas may be a mixed gas containing hydrogen bromide gas (HBr) as its main component and also containing a slight amount of other gas such as fluorine-containing gas. In this case, the flow rate of the other gas is, for example, within a range of 1/20 to 1/10, preferably 1/50 or less, of the flow rate of hydrogen bromide gas (HBr). Even in cases where the third mixed gas contains fluorine-containing gas and oxygen gas ($O_2$) as the other gas, the flow rate thereof is, as a matter of course, smaller than the flow rate of fluorine-containing gas and oxygen gas ($O_2$) contained in the second mixed gas. In this case, the flow rate of fluorine-containing gas and oxygen gas ($O_2$) in the third mixed gas is, for example, within a range of 1/20 to 1/10, preferably 1/50 or less, of the flow rate of fluorine-containing gas and oxygen gas ($O_2$) in the second mixed gas.

Further, it is desirable to over-etch the surface of the insulating layer 20 down by a thickness equal to, e.g., about 10% of the trench depth, to assure the insulating layer 20 being exposed. By undergoing the above process steps, the trench 70 is formed.

Figure 3A:
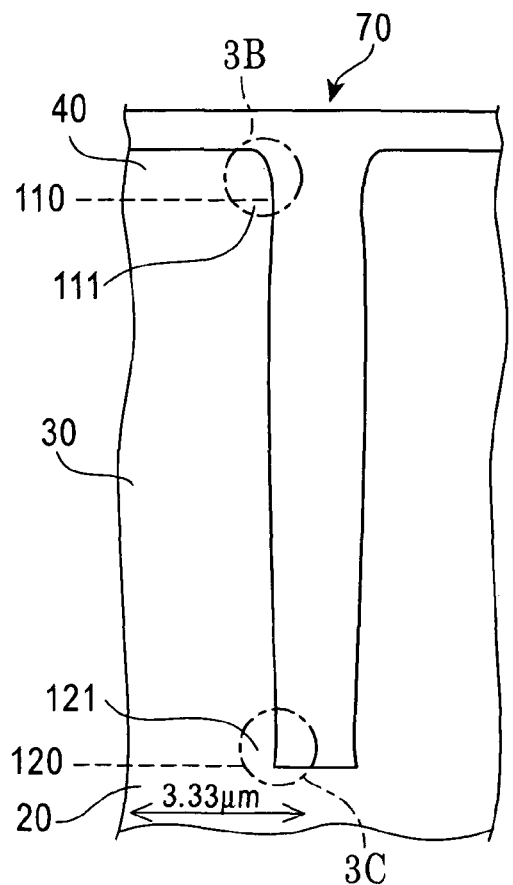
FIGS. 3A-3C are cross-sectional photographic images of a trench formed by the trench forming method according to the first embodiment.

FIG. 3A is a cross-sectional photographic image of the trench 70 formed by the trench forming method of the present embodiment. The trench depth is about 10 μm, and the trench width is about 1.8 μm. The trench 70 that reaches the insulating layer 20 is formed by etching the semiconductor layer 30 down by about 1 μm from the surface in the first etching step, then etching the layer 30 down by about 8 μm in the second etching step, and finally etching the layer 30 down by about 1 μm in the third etching step.

Figure 3B:
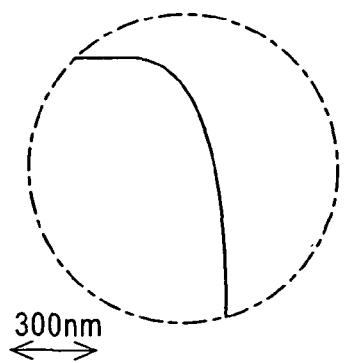
Figure 3C:
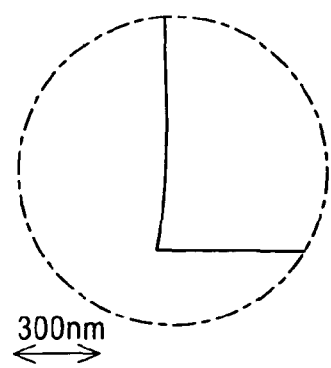

FIG. 3B is a cross-sectional photographic image showing, in enlarged view, a portion 111 of a boundary 110 between the masking oxide film 40 and the semiconductor layer 30. No gouge due to etching occurs at the boundary 110. FIG. 3C is a cross-sectional photographic image showing, in enlarged view, a portion 121 of a boundary 120 between the insulating layer 20 and the semiconductor layer 30. No gouge due to etching occurs at the boundary 120 either.

According to the trench forming method of the present embodiment as described above, in initial etching of the surface of the semiconductor layer, the etching is conducted using a mixed gas containing hydrogen bromide gas (HBr) (the first etching step). It is said that etching conducted using a mixed gas containing hydrogen bromide gas (HBr) is more likely to create so-called deposits (sediments) as compared to etching conducted using a mixed gas containing fluorine-containing gas (such as $SF_6$) and oxygen gas ($O_2$) but not hydrogen bromide gas (HBr). Thus, etching conducted using a mixed gas containing hydrogen bromide gas (HBr) does not give rise to gouges near the trench opening because the deposits adhering to the inner wall of the trench produce effects such as preventing the boundary between the masking oxide film and the semiconductor layer from being etched sideways.

Further, according to the trench forming method of the present embodiment, the surface of the semiconductor layer is first etched down by a thickness equal to about 10% of the entire trench depth, and then the semiconductor layer is etched down by a thickness equal to about 80% of the trench depth using a mixed gas containing fluorine-containing gas (such as $SF_6$) and oxygen gas ($O_2$) but not hydrogen bromide gas (HBr) (in the second etching step). Etching conducted using a mixed gas containing hydrogen bromide gas (HBr) tends to create deposits. Therefore, if etching were conducted using this mixed gas down to the insulating layer, a so-called tapered trench that gradually narrows would be formed. In contrast, by etching the semiconductor layer down by a thickness equal to about 80% of the entire trench depth using a mixed gas containing fluorine-containing gas (such as $SF_6$) and oxygen gas ($O_2$) but not hydrogen bromide gas (HBr) as in the present embodiment, a trench having vertical side walls can be formed in a relatively short time.

Further, according to the trench forming method of the present embodiment, after etching the semiconductor layer down to about 90% of the entire trench depth from the surface in the first and second etching steps, the layer is etched down by the remaining 10% of the depth using a mixed gas containing hydrogen bromide gas (HBr) (the third etching step). Etching conducted using a mixed gas containing hydrogen bromide gas (HBr) does not give rise to gouges at the bottom of the trench because the deposits adhering to the inner wall of the trench produce effects such as preventing the boundary between the insulating layer and the semiconductor layer from being etched sideways.

As described above, according to the trench forming method of the present embodiment, a mixed gas containing hydrogen bromide gas (HBr) is used as the etching gas when etching parts of the semiconductor layer near its boundary with the masking oxide film and near its boundary with the insulating layer, whereas a mixed gas containing fluorine-containing gas (such as $SF_6$) and oxygen gas ($O_2$) is used as the etching gas when etching the intermediate part of the semiconductor layer. By this means, without gouges being created at the boundary between the masking oxide film and the semiconductor layer and at the boundary between the insulating layer and the semiconductor layer, a trench having vertical side walls can be formed.

Second Embodiment

Figure 4A:
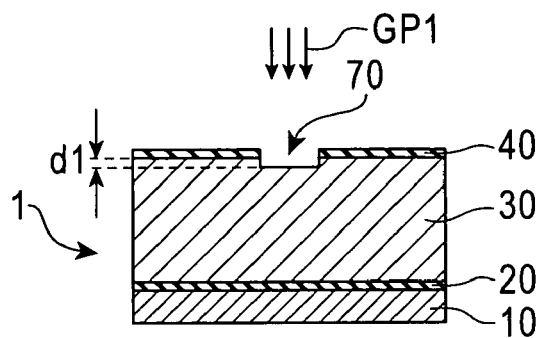
FIGS. 4A-4C are cross-sectional views of steps in a trench forming method according to a second embodiment.
Figure 4B:
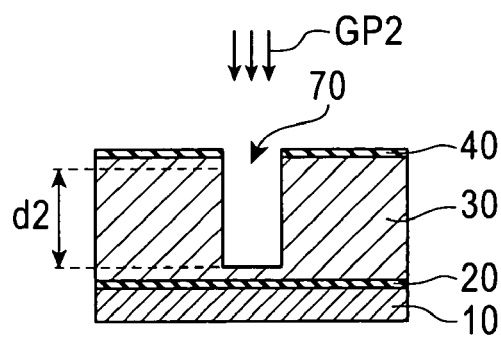
Figure 4C:
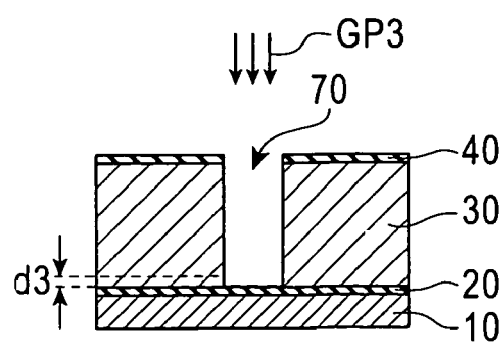

FIGS. 4A-4C are cross-sectional views of steps in a trench forming method according to the present embodiment. The steps of forming a trench in an SOI substrate 1 will be described below with reference to FIGS. 4A-4C. Note that the steps up to etching the masking oxide film 40 are the same as those in the first embodiment (FIGS. 2A and 2B).

After etching the masking oxide film 40, the semiconductor layer 30 is etched by dry etching with the masking oxide film 40 as a mask. The dry etching includes three etching steps.

First, the first etching step will be described with reference to FIG. 4A. The first etching step uses, as an etching gas, a first mixed gas containing chlorine gas ($Cl_2$). Note that the first mixed gas contains no hydrogen bromide gas (HBr). The SOI substrate 1 having the masking oxide film 40 formed thereon is secured to a substrate-securing table inside a not-shown chamber. The chamber is first evacuated, and the first mixed gas is then introduced into the chamber at a gas flow rate of, for example, 30 sccm for $Cl_2$, so that the chamber internal pressure is at 25 mT, for example. The surface of the semiconductor layer 30 is then etched with the masking oxide film 40 as a mask, by gas plasma GP1 of the first mixed gas created by a high-frequency electric field formed between the substrate-securing table and a not-shown electrode disposed opposite the table. At this time, the layer 30 is etched down by a thickness d1 equal to, e.g., about 10% of the distance from the surface of the semiconductor layer 30 to the insulating layer 20 (which distance is hereinafter referred to as a trench depth).

Note that the first mixed gas may be a gas consisting only of chlorine gas ($Cl_2$). Instead, the first mixed gas may be a mixed gas containing chlorine gas ($Cl_2$) as its main component and also containing a slight amount of other gas such as fluorine-containing gas. In this case, the flow rate of the other gas is, for example, within a range of 1/20 to 1/10, preferably 1/50 or less, of the flow rate of chlorine gas ($Cl_2$). Even in cases where the first mixed gas contains fluorine-containing gas and oxygen gas ($O_2$) as the other gas, the flow rate thereof is, as a matter of course, smaller than the flow rate of fluorine-containing gas and oxygen gas ($O_2$) contained in a second mixed gas in the subsequent second etching step. In this case, the flow rate of fluorine-containing gas and oxygen gas ($O_2$) in the first mixed gas is, for example, within a range of 1/20 to 1/10, preferably 1/50 or less, of the flow rate of fluorine-containing gas and oxygen gas ($O_2$) in the second mixed gas.

Next, the second etching step will be described with reference to FIG. 4B. The second etching step uses, as an etching gas, a second mixed gas containing fluorine-containing gas (such as $SF_6$) and oxygen gas ($O_2$). Note that the second mixed gas contains no hydrogen bromide gas (HBr). The first mixed gas is evacuated from the not-shown chamber, and the second mixed gas is then introduced into the chamber at a gas flow rate of, for example, 30 sccm for $SF_6$ and 30 sccm for $O_2$, so that the chamber internal pressure is at 25 mT, for example. The semiconductor layer 30 is then etched with the masking oxide film 40 as a mask, by gas plasma GP2 of the second mixed gas created in the same way as above. At this time, the layer 30 is etched down by a thickness d2 equal to, e.g., about 80% of the trench depth.

Note that the second mixed gas may be a mixed gas consisting only of fluorine-containing gas (such as $SF_6$) and oxygen gas ($O_2$) and containing no other gas whatsoever such as chlorine gas ($Cl_2$). Instead, the second mixed gas may be a mixed gas containing fluorine-containing gas (such as $SF_6$) and oxygen gas ($O_2$) as its main components and also containing a slight amount of other gas such as chlorine gas ($Cl_2$). In this case, the flow rate of the other gas is, for example, within a range of 1/20 to 1/10, preferably 1/50 or less, of the total flow rate of fluorine-containing gas (such as $SF_6$) and oxygen gas ($O_2$). Even in cases where the second mixed gas contains chlorine gas ($Cl_2$) as the other gas, the flow rate thereof is, as a matter of course, smaller than the flow rate of chlorine gas ($Cl_2$) contained in the first mixed gas. In this case, the flow rate of chlorine gas ($Cl_2$) in the second mixed gas is, for example, within a range of 1/20 to 1/10, preferably 1/50 or less, of the flow rate of chlorine gas ($Cl_2$) in the first mixed gas. Further, the flow rate of chlorine gas ($Cl_2$) in the second mixed gas is smaller than the flow rate of chlorine gas ($Cl_2$) contained in a third mixed gas in the subsequent third etching step. In this case, the flow rate of chlorine gas ($Cl_2$) in the second mixed gas is, for example, within a range of 1/20 to 1/10, preferably 1/50 or less, of the flow rate of chlorine gas ($Cl_2$) in the third mixed gas.

Next, the third etching step will be described with reference to FIG. 4C. The third etching step uses, as an etching gas, a third mixed gas containing chlorine gas ($Cl_2$). Note that the third mixed gas contains no hydrogen bromide gas (HBr). The second mixed gas is evacuated from the not-shown chamber, and the third mixed gas is then introduced into the chamber at a gas flow rate of, for example, 30 sccm for $Cl_2$, so that the chamber internal pressure is at 25 mT, for example. The semiconductor layer 30 is then etched with the masking oxide film 40 as a mask, by gas plasma GP3 of the third mixed gas created in the same way as above. At this time, the layer 30 is etched down by a thickness d3 equal to, e.g., about 10% of the trench depth.

Note that the third mixed gas may be a gas consisting only of chlorine gas ($Cl_2$). Instead, the third mixed gas may be a mixed gas containing chlorine gas ($Cl_2$) as its main component and also containing a slight amount of other gas such as fluorine-containing gas. In this case, the flow rate of the other gas is, for example, within a range of 1/20 to 1/10, preferably 1/50 or less, of the flow rate of chlorine gas ($Cl_2$). Even in cases where the third mixed gas contains fluorine-containing gas and oxygen gas ($O_2$) as the other gas, the flow rate thereof is, as a matter of course, smaller than the flow rate of fluorine-containing gas and oxygen gas ($O_2$) contained in the second mixed gas. In this case, the flow rate of fluorine-containing gas and oxygen gas ($O_2$) in the third mixed gas is, for example, within a range of 1/20 to 1/10, preferably 1/50 or less, of the flow rate of fluorine-containing gas and oxygen gas ($O_2$) in the second mixed gas.

Further, it is desirable to over-etch the surface of the insulating layer 20 down by a thickness equal to, e.g., about 10% of the trench depth, to assure the insulating layer 20 being exposed. By undergoing the above process steps, the trench 70 is formed.

Figure 5A:
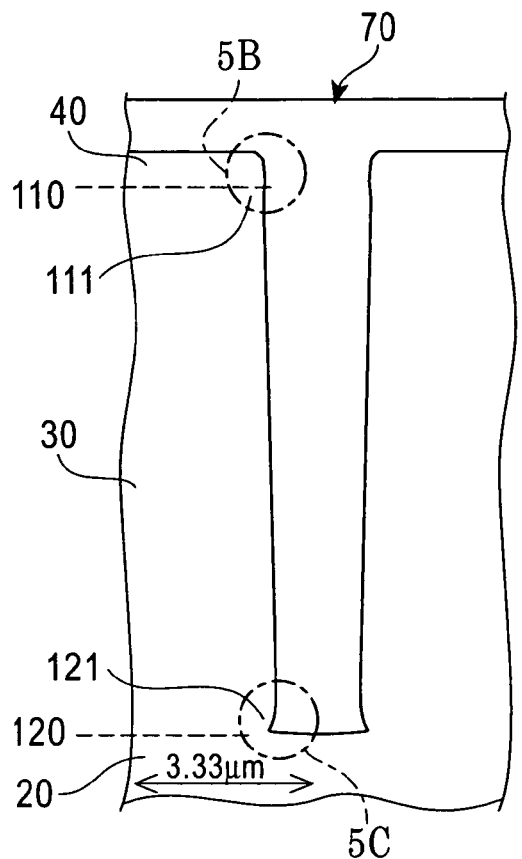
FIGS. 5A-5C are cross-sectional photographic images of a trench formed by the trench forming method according to the second embodiment.

FIG. 5A is a cross-sectional photographic image of the trench 70 formed by the trench forming method of the present embodiment. The trench depth is about 10 μm, and the trench width is about 1.8 μm. The trench 70 that reaches the insulating layer 20 is formed by etching the semiconductor layer 30 down by about 1 μm from the surface in the first etching step, then etching the layer 30 down by about 8 μm in the second etching step, and finally etching the layer 30 down by about 1 μm in the third etching step.

Figure 5B:
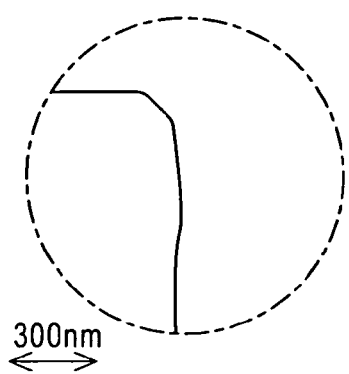
Figure 5C:
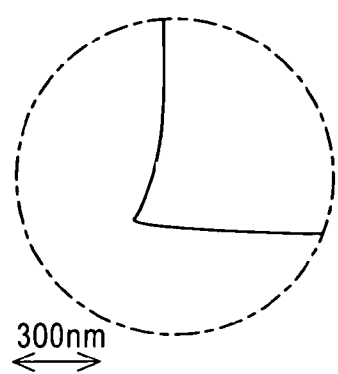

FIG. 5B is a cross-sectional photographic image showing, in enlarged view, a portion 111 of a boundary 110 between the masking oxide film 40 and the semiconductor layer 30. No gouge due to etching occurs at the boundary 110. FIG. 5C is a cross-sectional photographic image showing, in enlarged view, a portion 121 of a boundary 120 between the insulating layer 20 and the semiconductor layer 30. No gouge due to etching occurs at the boundary 120 either.

According to the trench forming method of the present embodiment as described above, in initial etching of the surface of the semiconductor layer, the etching is conducted using a mixed gas containing chlorine gas ($Cl_2$) (the first etching step). It is said that etching conducted using a mixed gas containing chlorine gas ($Cl_2$) is likely to create deposits (sediments). Thus, etching conducted using a mixed gas containing chlorine gas ($Cl_2$) does not give rise to gouges near the trench opening because the deposits adhering to the inner wall of the trench produce effects such as preventing the boundary between the masking oxide film and the semiconductor layer from being etched sideways.

Further, according to the trench forming method of the present embodiment, the surface of the semiconductor layer is first etched down by a thickness equal to about 10% of the entire trench depth, and then the semiconductor layer is etched down by a thickness equal to about 80% of the trench depth using a mixed gas containing fluorine-containing gas (such as $SF_6$) and oxygen gas ($O_2$) but not chlorine gas ($Cl_2$) (in the second etching step). Because the semiconductor layer is etched using this mixed gas which is considered less prone to form deposits, a trench having vertical side walls can be formed in a relatively short time.

Further, according to the trench forming method of the present embodiment, after etching the semiconductor layer down to about 90% of the entire trench depth from the surface in the first and second etching steps, the layer is etched down by the remaining 10% of the depth using a mixed gas containing chlorine gas ($Cl_2$) (the third etching step). Etching conducted using a mixed gas containing chlorine gas ($Cl_2$) does not give rise to gouges at the bottom of the trench because the deposits adhering to the inner wall of the trench produce effects such as preventing the boundary between the insulating layer and the semiconductor layer from being etched sideways.

Note that in the first and third etching steps of the present embodiment, since containing chlorine gas ($Cl_2$), the mixed gas does not need to contain hydrogen bromide gas (HBr). Further, in the second etching step of the present embodiment, the mixed gas usually contains no hydrogen bromide gas (HBr) in order to form a trench having vertical side walls.

As described above, according to the trench forming method of the present embodiment, a mixed gas containing chlorine gas ($Cl_2$) is used as the etching gas when etching parts of the semiconductor layer near its boundary with the masking oxide film and near its the boundary with the insulating layer, whereas a mixed gas containing fluorine-containing gas (such as $SF_6$) and oxygen gas ($O_2$) is used as the etching gas when etching the intermediate part of the semiconductor layer. By this means, without gouges being created at the boundary between the masking oxide film and the semiconductor layer and at the boundary between the insulating layer and the semiconductor layer, a trench having vertical side walls can be formed.

Further, using chlorine gas ($Cl_2$) having a high etching rate as the etching gas also produces the effect of shortening the etching process time as compared to cases where hydrogen bromide gas (HBr) is used.

The first and second embodiments employ three etching steps to form a trench. However, a trench may be formed using four or more etching steps. For example, in order to keep the side walls of the intermediate portion of the trench from expanding outward too much in cases where the trench depth is large, the trench may be formed by first etching down to 10% of the trench depth from the surface using a mixed gas containing hydrogen bromide gas (HBr) in a first etching step, then etching down to 40% of the trench depth from the surface using a mixed gas containing fluorine-containing gas (such as $SF_6$) and oxygen gas ($O_2$) in a second etching step, then etching down to 50% of the trench depth using a mixed gas containing hydrogen bromide gas (HBr) in a third etching step, then etching down to 90% of the trench depth using a mixed gas containing fluorine-containing gas (such as $SF_6$) and oxygen gas ($O_2$) in a fourth etching step, and finally etching down to 100% of the trench depth using a mixed gas containing hydrogen bromide gas (HBr).

This application is based on Japanese Patent Application No. 2009-037807 which is herein incorporated by reference.

What is claimed is:

1. A trench forming method, comprising:
    a substrate preparation step of preparing an SOI substrate in which an insulating layer and a silicon semiconductor layer are laid one over another on a support substrate;

an oxide film forming step of forming an oxide film on a surface of said silicon semiconductor layer;

an oxide film removing step of removing a portion of said oxide film; and an etching step of etching, using at least two types of etching gases that have different compositions to each other, said surface of said silicon semiconductor layer with said oxide film as a mask to form a trench that reaches said insulating layer and has a constant cross-sectional area along its entire depth, wherein said etching step includes at least three etching steps, each etching said silicon semiconductor layer with a respective depth to form a respective portion of the trench by using, as an etching gas, one of the at least two types of etching gases.

2. A trench forming method according to claim 1, wherein said etching step includes:

a first etching step of performing etching using, as an etching gas, a first etching gas containing hydrogen bromide gas;

a second etching step of performing etching using, as an etching gas, a second etching gas containing fluorine-containing gas and oxygen gas; and a third etching step of performing etching using, as an etching gas, a third etching gas containing hydrogen bromide gas.

3. A trench forming method according to claim 2, wherein said second etching gas contains no hydrogen bromide gas.

4. A trench forming method according to claim 2, wherein an amount of any hydrogen bromide gas contained in said second etching gas is smaller than an amount of the hydrogen bromide gas contained in said first etching gas and is also smaller than an amount of the hydrogen bromide gas contained in said third etching gas.

5. A trench forming method according to claim 1, wherein said etching step includes:

a first etching step of performing etching using, as an etching gas, a first etching gas containing chlorine gas;

a second etching step of performing etching using, as an etching gas, a second etching gas containing fluorine-containing gas and oxygen gas; and a third etching step of performing etching using, as an etching gas, a third etching gas containing chlorine gas.

6. A trench forming method according to claim 5, wherein said second etching gas contains no chlorine gas.

7. A trench forming method according to claim 5, wherein an amount of any chlorine gas contained in said second etching gas is smaller than an amount of the chlorine gas contained in said first etching gas and is also smaller than an amount of the chlorine gas contained in said third etching gas.

8. A trench forming method according to claim 5, wherein no hydrogen bromide gas is contained in said first etching gas, said second etching gas and said third etching gas.

9. A trench forming method according to claim 2, wherein an etching depth in said first etching step and an etching depth in said third etching step are smaller than an etching depth in said second etching step.

10. A trench forming method according to claim 9, wherein said etching depth in said first etching step is equal to 10% of a depth of said trench, said etching depth in said second etching step is equal to 80% of the depth of said trench, and said etching depth in said third etching step is equal to 10% of the depth of said trench.

11. A trench forming method, comprising:

preparing an SOI (Silicon On Insulator) substrate in which an insulating layer is formed on a support substrate and includes a bottom surface facing the support substrate and a top surface opposite to the bottom surface, a silicon semiconductor layer being formed on the top surface of the insulating layer and including a bottom surface facing the top surface of the insulating layer and a top surface opposite to the bottom surface thereof;

forming an oxide film on the top surface of said silicon semiconductor layer;

removing a portion of said oxide film; and etching, using at least two types of etching gases that have different compositions to each other, the top surface of said silicon semiconductor layer with said oxide film as a mask to form a trench that reaches said insulating layer and has a constant cross-sectional area along its entire depth, wherein said etching includes at least three etching steps, each etching said silicon semiconductor layer with a respective depth to form a respective portion of the trench by using, as an etching gas, one of the at least two types of etching gases.

* * * * *